(12) United States Patent
Rele et al.

(10) Patent No.: US 8,938,704 B1
(45) Date of Patent: Jan. 20, 2015

(54) CIRCUIT MODULE GENERATION FOR PROGRAMMABLE INTEGRATED CIRCUITS

(71) Applicant: Xilinx, Inc., San Jose, CA (US)

(72) Inventors: Siddharth Rele, Navi Mumbai (IN); David A. Knol, Morgan Hill, CA (US); Sumit Nagpal, Hyderabad (IN); Avdhesh Palliwal, Hyederabad (IN); Brendan M. O'Higgins, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/444,693

(22) Filed: Jul. 28, 2014

(51) Int. Cl.
 *G06F 17/50* (2006.01)
(52) U.S. Cl.
 CPC ........ *G06F 17/5054* (2013.01); *G06F 17/5081* (2013.01)
 USPC .......................................................... 716/117
(58) Field of Classification Search
 USPC .......................................................... 716/117
 See application file for complete search history.

(56) References Cited

U.S. PATENT DOCUMENTS

| 7,636,907 | B1 * | 12/2009 | Das et al. | 716/138 |
| 8,181,139 | B1 * | 5/2012 | Chen et al. | 716/121 |
| 2008/0209383 | A1 * | 8/2008 | Mayer | 716/13 |

* cited by examiner

*Primary Examiner* — Suresh Memula
(74) *Attorney, Agent, or Firm* — Robert M. Brush

(57) ABSTRACT

An exemplary method of implementing a circuit design for a programmable integrated circuit (IC) includes, on at least one programmed processor, performing operations including: generating a description of circuit components of the circuit design including first portion of a circuit module that is independent of assignment of resources of the programmable IC; assigning a plurality of the resources of the programmable IC to a plurality of the circuit components including determining at least one resource assignment for the circuit module; and generating a physical implementation of the circuit components for implementation in the programmable IC, including generating a second portion of the circuit module that is dependent on the at least one resource assignment, and combining the second portion of the circuit module with the first portion of the circuit module.

20 Claims, 7 Drawing Sheets

US 8,938,704 B1

CIRCUIT MODULE GENERATION FOR PROGRAMMABLE INTEGRATED CIRCUITS

TECHNICAL FIELD

Examples of the present disclosure generally relate to electronic circuit design and, in particular, to circuit module generation for programmable devices.

BACKGROUND ART

Programmable integrated circuits (ICs) are often used to implement digital logic operations according to user configurable input. Example programmable ICs include complex programmable logic devices (CPLDs) and field programmable gate arrays (FPGAs). CPLDs often include several function blocks that are based on a programmable logic array (PLA) architecture with sum-of-products logic. A configurable interconnect matrix transmits signals between the function blocks.

One type of FPGA includes an array of programmable tiles. The programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

A conventional design process for programmable ICs begins with the creation of the design. The design is then compiled for implementation in a particular programmable IC device. The design can include user designed circuits, as well as one or more pre-designed circuit modules, sometimes referred to as "Intellectual Property (IP) cores." Such IP cores can be parameterized and added to a design before the design is implemented for a programmable IC device. Some IP cores, however, require information about resource-mapping prior to implementation of the design (e.g., at design-time). Assigning resources, such as input/output (IO) resources, to IP cores at design-time can lead to resource contention and conflict, particularly if the design includes multiple IP cores. Further, if a design wishes to alter resource assignments, the designer must return to the design stage, re-assign resources to the IO core(s), and repeat the implementation process.

SUMMARY

Circuit module generation for programmable devices is described. In an example implementation, a method of implementing a circuit design for a programmable integrated circuit (IC) includes, on at least one programmed processor, performing operations including: generating a description of circuit components of the circuit design including first portion of a circuit module that is independent of assignment of resources of the programmable IC; assigning a plurality of the resources of the programmable IC to a plurality of the circuit components including determining at least one resource assignment for the circuit module; and generating a physical implementation of the circuit components for implementation in the programmable IC, including generating a second portion of the circuit module that is dependent on the at least one resource assignment, and combining the second portion of the circuit module with the first portion of the circuit module.

In another example implementation, a computer system including a circuit design tool executing therein configured to implement a circuit design for a programmable integrated circuit (IC), wherein the circuit design tool is programmed to: generate a description of circuit components of the circuit design including first portion of a circuit module that is independent of assignment of resources of the programmable IC; assign a plurality of the resources of the programmable IC to a plurality of the circuit components including determining at least one resource assignment for the circuit module; and generate a physical implementation of the circuit components for implementation in the programmable IC, including generating a second portion of the circuit module that is dependent on the at least one resource assignment, and combining the second portion of the circuit module with the first portion of the circuit module.

In another example implementation, a non-transitory computer-readable storage medium comprising instructions, which when executed in a computer system, causes the computer system to carry out a method of implementing a circuit design for a programmable integrated circuit (IC), comprising: generating a description of circuit components of the circuit design including first portion of a circuit module that is independent of assignment of resources of the programmable IC; assigning a plurality of the resources of the programmable IC to a plurality of the circuit components including determining at least one resource assignment for the circuit module; and generating a physical implementation of the circuit components for implementation in the programmable IC, including generating a second portion of the circuit module that is dependent on the at least one resource assignment, and combining the second portion of the circuit module with the first portion of the circuit module.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

DETAILED DESCRIPTION

Circuit module generation for programmable integrated circuits (ICs) is described. In one example, a method of implementing a circuit design for a programmable IC includes generating a logical description of circuit components of the circuit design including a first portion of a circuit module that is independent of assignment of first resources of the programmable IC. That is, the first portion of the circuit module is "resource-assignment-independent." The circuit module can be a pre-designed module (e.g., an Intellectual Property (IP) core). The first resources can be any set of resources in the programmable IC. For example, the first resources can be input/output (IO) resources of the programmable IC. After the logical description of the circuit design is generated, first resources of the programmable IC are assigned to circuit components. The resource assignments include at least one resource assignment to the circuit module. A physical description of the circuit components is generated for implementation in the programmable IC, which includes generating a second portion of the circuit module that is dependent on the resource assignment(s). That is, the second portion of the circuit module is "resource-assignment-dependent." The second portion of the circuit module is then combined with the first portion.

Splitting the circuit module into resource-assignment-dependent and resource-assignment-independent parts allows the resource-assignment-independent portion to be generated during the design entry phase, while the resource-assignment-dependent portion can be generated modularly, later in the design flow (e.g., during the design implementation phase). By deferring resource assignment until after design entry, resources can be assigned to the circuit module together with the rest of the circuit design, avoiding conflicts and contention among resources, as well as providing a user-friendly design flow where all resource assignments are performed together in one step. In addition, modular design-rule-checks (DRGs) can be utilized at multiple points in the flow. For example, DRCs can be performed during both resource assignment and during implementation. This ensures consistency between steps in the flow.

Figure 1:
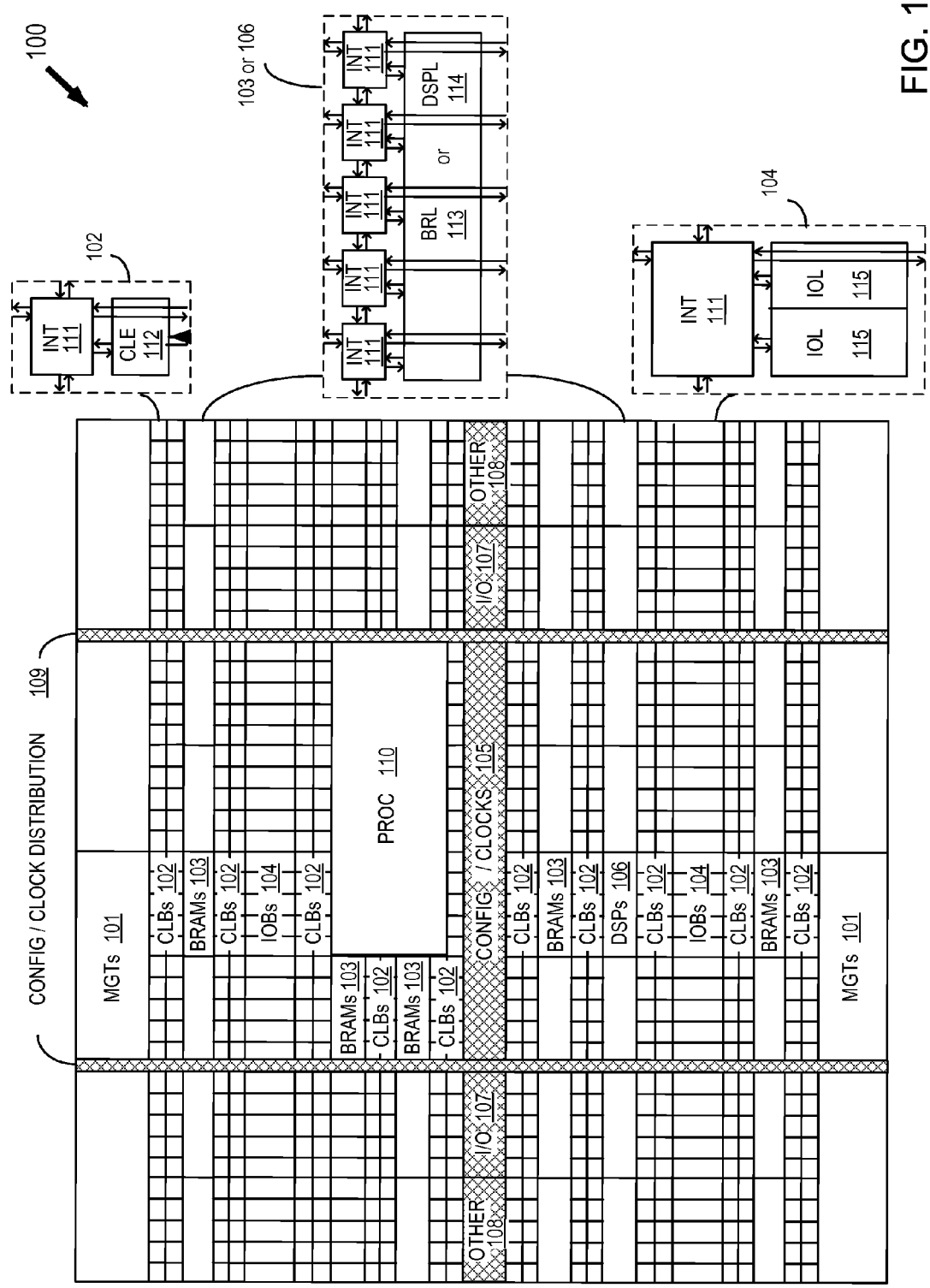
FIG. 1 illustrates an FPGA architecture according to an example implementation.

The programmable IC can be a field programmable gate array (FPGA), complex programmable logic device (CPLD), or another type of IC that has a specific set of resources onto which circuit designs can be mapped and implemented. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
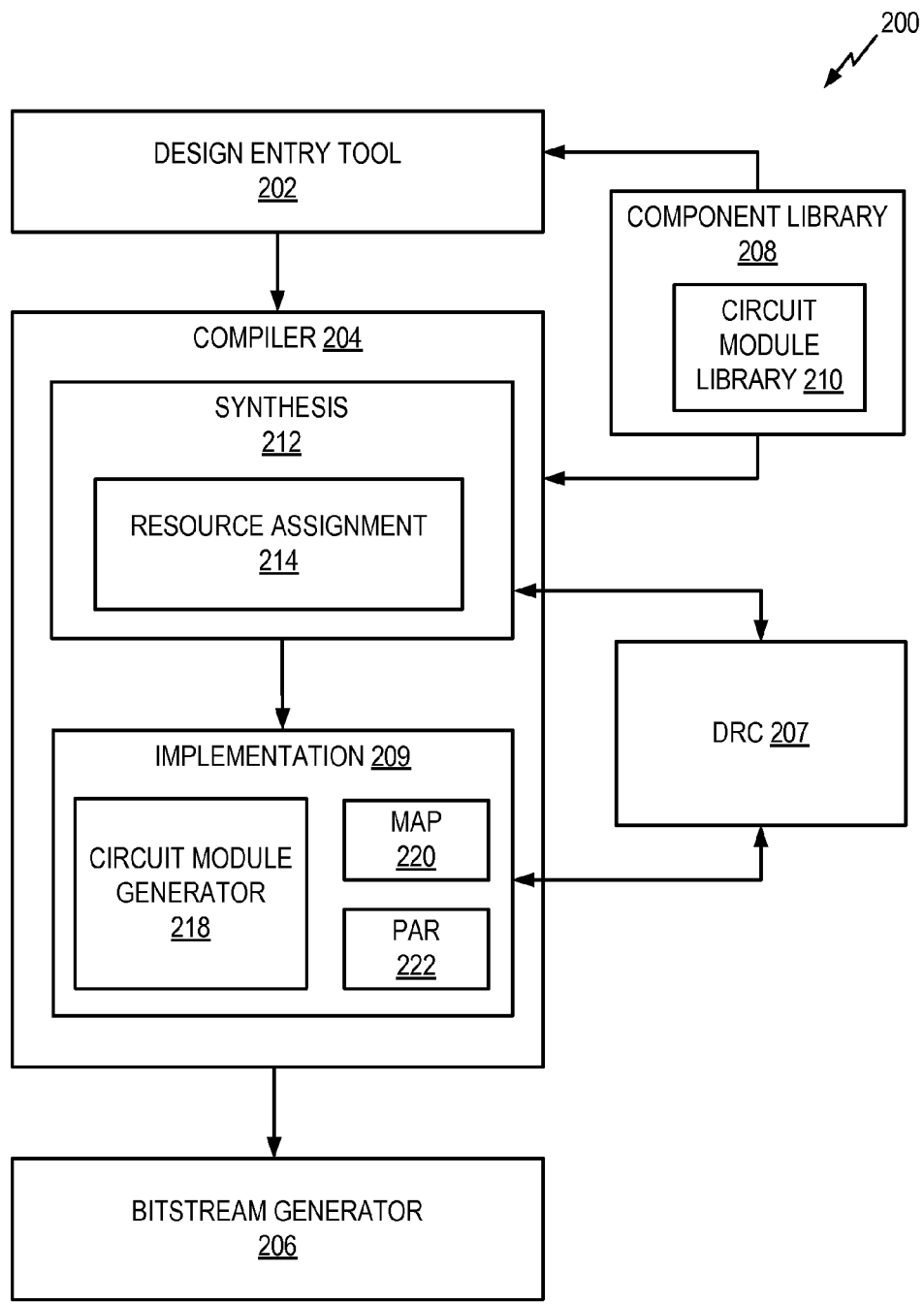
FIG. 2 is a block diagram depicting a circuit design system according to an example implementation.

FIG. 2 is a block diagram depicting a circuit design system 200 according to an example implementation. The circuit design system 200 includes at least one tool that handles different functions of the circuit design system 200. Each tool can be implemented by circuitry that is part of an electronic system, by firmware in the electronic system, by software in the electronic system, or by a combination thereof. While certain functions are described as being performed by specific tools, it is to be understood that the functions can be performed by other configurations of tool(s). An example electronic system in which the circuit design system 200 can be implemented is described below with respect to FIG. 7.

In general, the circuit design system 200 generates a description of the circuit design, which is processed into a physical implementation ("implementation") of the circuit design for a particular programmable IC. The circuit design system 200 can process the description of the circuit design through various intermediate transformations to produce the implementation of the circuit design, including a functional description and a logical description. The implementation of the circuit design can be formatted and loaded into a programmable IC to produce a physical circuit. Thus, the circuit design system 200 transforms an abstract representation of the circuit design (the description) into a physical representation of the circuit design (the implementation) that can be formatted and loaded into a programmable IC to produce a physical circuit.

The circuit design system 200 includes a design entry tool 202, a compiler tool ("compiler 204"), and a bitstream generator tool ("bitstream generator 206"). The design entry tool 202 is configured to generate a functional description of the circuit design in response to user input. The functional description can include descriptions for a plurality of circuit components, such as flip-flops, memories, logic gates, processors, and the like, coupled together by connections (referred to as "nets" or "signals"). Example functional descriptions include a schematic description, a structural description, a behavioral description, or a combination thereof.

The design entry tool 202 may include a graphic user interface (GUI) through which a user connects symbols and blocks representing various components to produce a schematic description of the circuit design. In another example, the design entry tool 202 can also include a text interface through which a user writes hardware description language (HDL) code to produce a structural and/or behavioral description of the circuit design in terms of HDL constructs. The design entry tool 202 can employ a combination of schematic and HDL entry.

The design entry tool 202 can obtain circuit component descriptions from a component library 208. The component library 208 can include descriptions for various circuit components, such as flip-flops, memories, processors, logic gates, and the like. The component library 208 can also include a circuit module library 210. The circuit module library 210 includes descriptions of circuit modules. A "circuit module" is a pre-defined description of a circuit that can perform a particular function. A circuit module can also include a pre-defined implementation. For example, a circuit module may be been processed for a different circuit design and an implementation of the circuit module generated. The previous implementation may be stored in the circuit module library 210. Example circuit modules include IP cores, such as memory interfacing cores, network interface cores, digital signal processing (DSP) cores, soft processor cores, communication protocol cores, and the like.

A circuit module can include a resource-assignment-independent portion and a resource-assignment-dependent portion. A "resource-assignment-independent" portion of a circuit module is independent of assignment of resources in the programmable IC (e.g., independent of IOBs, CLBs, BRAMs, etc. in an FPGA). A "resource-assignment-dependent" portion of a circuit module is dependent on at least one resource assignment of resource(s) in the programmable IC (e.g., dependent on a particular configuration of IOBs).

A circuit module can include one or more parameters that define aspects of the circuit module (e.g., the circuit module can be parameterized). Some of the parameters can define aspects of the resource-assignment-independent portion of the circuit module. Others of the parameters can define aspects of the resource-assignment-dependent portion of the circuit module. Once all of the parameters have been set, a complete implementation of the circuit module can be generated.

The design entry tool 202 can instantiate one or more circuit modules from the circuit module library 210 into the functional description of the circuit design. For each circuit module, the design entry tool 202 can define the parameter(s) that support the instantiation of the circuit module. When a circuit module has resource-assignment-dependent and resource-assignment-independent parts, the design entry tool 202 instantiates only the resource-assignment-independent portion in the functional description and thus only defines the parameters relevant to the resource-assignment-independent portion. Any parameters associated with the resource-assignment-dependent portion of a circuit module will be defined later in the flow.

For example, a circuit module that performs IO functions can include various parameters defining an IO interface, such as the number of IO ports, the width of each IO port, and the number of banks of IO resources of the programmable IC. The number of IO ports and the width of each port can be defined along with the resource-assignment-independent portion of the circuit module. The number of banks of IO resources in the programmable IC used to implement the IO ports can be defined along with the resource-assignment-dependent portion of the circuit module and is not defined by the design entry tool 202. Once the relevant parameters are defined, the resource-assignment-independent portion of the circuit module can be instantiated. The resource-assignment-independent portion of the circuit module does not include mappings or assignments of IO resources in the programmable IC. Rather, the design entry tool 202 can instantiate the IO ports as general logic elements having the characteristics of the specified parameters.

The compiler 204 is configured to process the functional description of the circuit design to produce a physical implementation of the circuit design. The compiler 204 can include a synthesis tool 212 and an implementation tool 209. The synthesis tool 212 can include a resource assignment tool 214. The implementation tool 209 can include a circuit module generator tool ("circuit module generator 218"), a map tool 220, and a place-and-route (PAR) tool 222.

The synthesis tool 212 is configured to produce a logical description of the circuit design from the functional description. The logical description of the circuit design includes a logical representation of the circuit design in terms of specific logic elements. For example, the logical description can include a register transfer level (RTL) description that represents the circuit design in terms of generic logic elements, such as adders, multipliers, counters, logic gates, and the like. In another example, the logical description can include a representation of the circuit design in terms of specific logic elements optimized to the architecture of the programmable IC, such as lookup tables (LUTs), carry logic, IO buffers, and like technology-specific components. In an example, the logical description includes a logical network list ("netlist") supported by the target programmable IC.

The resource assignment tool 214 is configured to assign some resources of the programmable IC to circuit components of the circuit design, including circuit module(s) defined therein. The resources can be confined to a particular set of resources. For example, the programmable IC can include a set of IO resources, such as IOBs. The resource assignment tool 214 can define IO resource assignments for circuit components of the circuit design, including any circuit modules. Thus, in addition to the logic elements, the logical description includes some resource assignments for the logic elements representing the circuit design, including some resource assignments for those logic elements representing circuit module(s).

The implementation tool 209 is configured to produce a physical implementation of the circuit design from the logical description. The implementation of the circuit design is a physical representation of the circuit design for implementation in a target programmable IC (e.g., a circuit design implementation). The map tool 220 is configured to map the logic elements in the logical description onto primitive components within the target programmable IC (e.g., CLBs, IOBs, BRAMs, etc. of a target FPGA). The PAR tool 222 is configured to place the mapped primitive components within the target programmable IC and route interconnects (e.g., signal conductors of the programmable interconnect) for the placed primitive components. The PAR tool 222 produces a physical implementation of the circuit design for a target programmable IC.

The circuit module generator 218 is configured to generate resource-assignment-dependent portion(s) of circuit module(s). The circuit module generator 218 generates the resource-assignment-dependent portion of a circuit module based at least on part on the resource assignment(s) made to the circuit module by the resource assignment tool 214. The circuit module generator 218 combines the resource-assignment-dependent portion with the resource-assignment-independent portion of the circuit module. The circuit module is then mapped, placed, and routed as described above.

In one example, the circuit module generator 218 translates resource assignment(s) for a circuit module into parameter(s) for the circuit module and generates the resource-assignment-dependent portion based at least in part on the parameters ("forward translation" of resource assignments to parameters). As discussed above, some parameters for a circuit module may have been defined by the design entry tool 202, while other parameters associated with the resource-assignment-dependent portion were left undefined. Now that the circuit module has resource-assignments, the circuit module generator 218 can translate these assignments into parameters to complete the parameterization of the circuit module. For example, if a parameter of a circuit module specifies the number of banks of IO resources to be used in the target programmable IC, then the circuit module generator 218 can translate a resource assignment specifying the number of banks to the corresponding parameter.

In one example, the circuit module generator 218 can also translate parameters for the circuit module into resource assignments ("backward translation" of parameters to resource assignments). As discussed above, in some cases, a circuit module may already have an implementation stored in the circuit module library 210. The pre-defined implementation is associated with a specific configuration of parameters. The circuit module generator 218 can translate some of these parameters as specified in the pre-defined implementation to resource assignments. The circuit module generator 218 can compare the resource assignments derived from the pre-defined implementation with resource assignments assigned for the current instantiation of the circuit module. If the resource assignments match, the circuit module generator 218 can obtain and use the resource-assignment-dependent portion of the circuit module from the pre-defined implementation. If the resource assignments do not match, the circuit module generator 218 regenerates the resource-assignment-dependent portion of the circuit module using new parameters translated from the current resource assignments.

The bitstream generator 206 is configured to format the physical implementation into a format for programming the programmable IC. For example, the bitstream generator 206 can generate a configuration bitstream from the physical implementation for configuring an FPGA. In general, the bitstream generator 206 can format the physical implementation into other types of data formats required to program a physical circuit in the programmable IC.

In one example, the circuit design system 200 includes a design rule check (DRC) tool 207. The DRC tool 207 can perform design rule checks at various phases of the design. In one example, the DRC tool 207 performs DRC check(s) on the logical description after the resource assignments have been made. In another example, the DRC tool 207 performs DRC check(s) on the physical implementation after the resource-assignment-dependent portion(s) of the circuit module(s) have been generated. The DRC tool 207 can use the same DRC checks between the logical description and the physical implementation.

Figure 3:
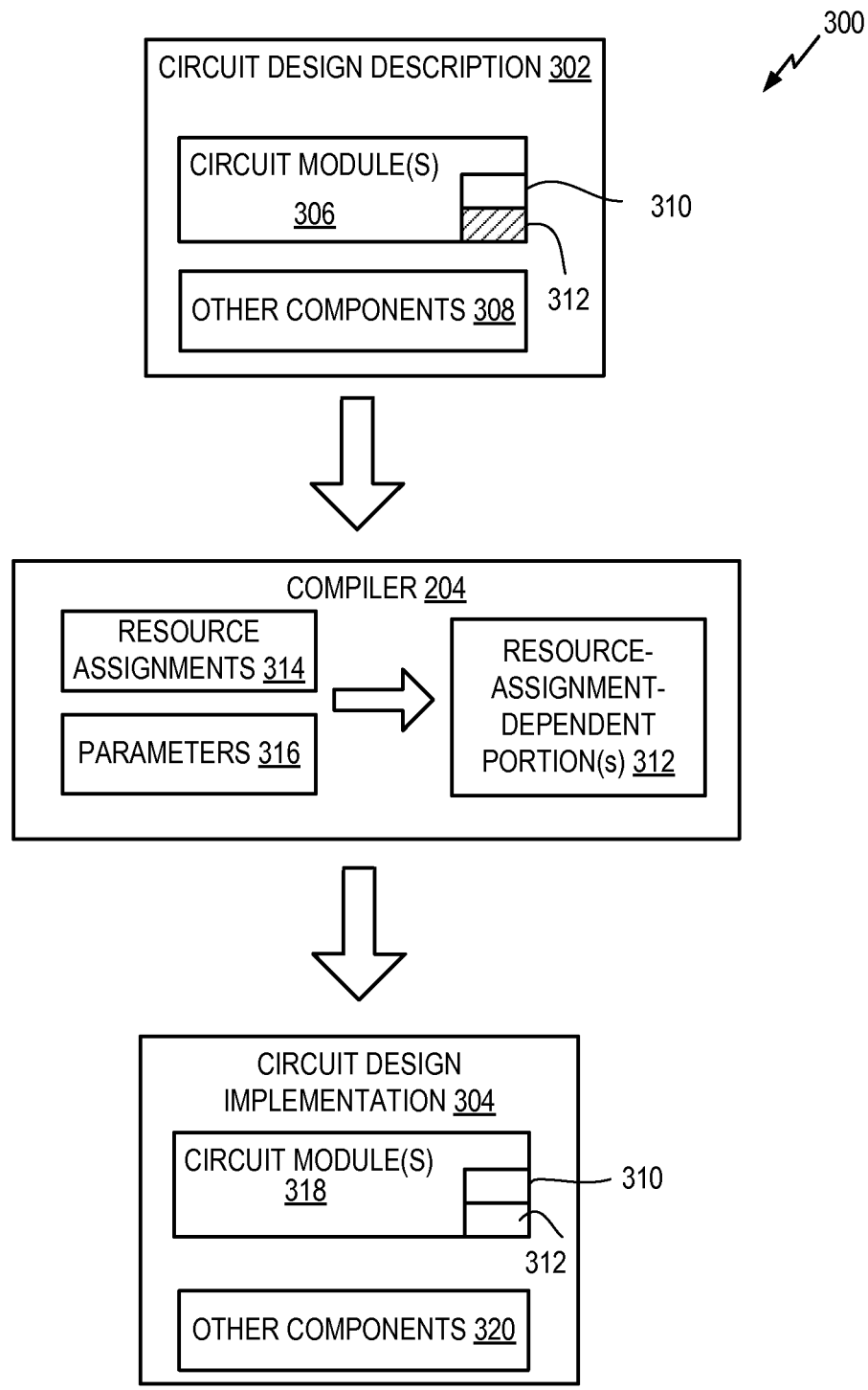
FIG. 3 is a block diagram depicting a flow through the circuit design system of FIG. 2 of an example circuit design according to an example implementation.

FIG. 3 is a block diagram depicting a flow 300 through the circuit design system 200 of an example circuit design according to an example implementation. Elements that are the same or similar to those of FIG. 2 are designated with identical reference numerals and are discussed in detail above. A circuit design description 302 includes instantiated components, including at least one circuit module 306 and various other components 308. Each of the circuit module(s) 306 includes a resource-assignment-independent portion 310 and a resource-assignment-dependent portion 312. The resource-assignment-dependent portion 312 is shown with a hash fill to indicate that the portion is omitted from the circuit design description 302. That is, for each of the circuit module(s) 306, the circuit design description 302 only includes the resource-assignment-independent portion 310.

The compiler 204 processes the circuit design description 302 to produce the circuit design implementation 304. For clarity, the specific tools of the compiler 204 have been omitted in FIG. 3. The compiler 204 processes resource assignments 314 and parameters 316 for the circuit module(s) 306 to generate resource-assignment-dependent portion(s) 312. As noted above, some parameters can be defined for the circuit module(s) 306 at the design entry phase in order to generate the circuit module(s) 306 in the circuit design description 302. The specification of other parameters is deferred to the compilation phase. The compiler 204 can translate resource assignments for the circuit module(s) 306 into parameters. The compiler 204 uses the resource assignments 314 to complete the set of parameters 316 so that the resource-assignment-dependent portion(s) of the circuit module(s) 306 can be generated. As discussed above, the compiler 204 can also use backwards translation to verify that new implementation(s) of the resource-assignment-dependent portion(s) need to be regenerated in case pre-defined implementation(s) exist.

The circuit design implementation 304 includes physical representations of the circuit module(s) 306 (shown as "circuit module(s) 318") and the other components 308 (shown as "other components 320"). The circuit module(s) 318 include both the resource-assignment-independent and the resource-assignment-dependent portions 310 and 312, respectively.

Figure 4:
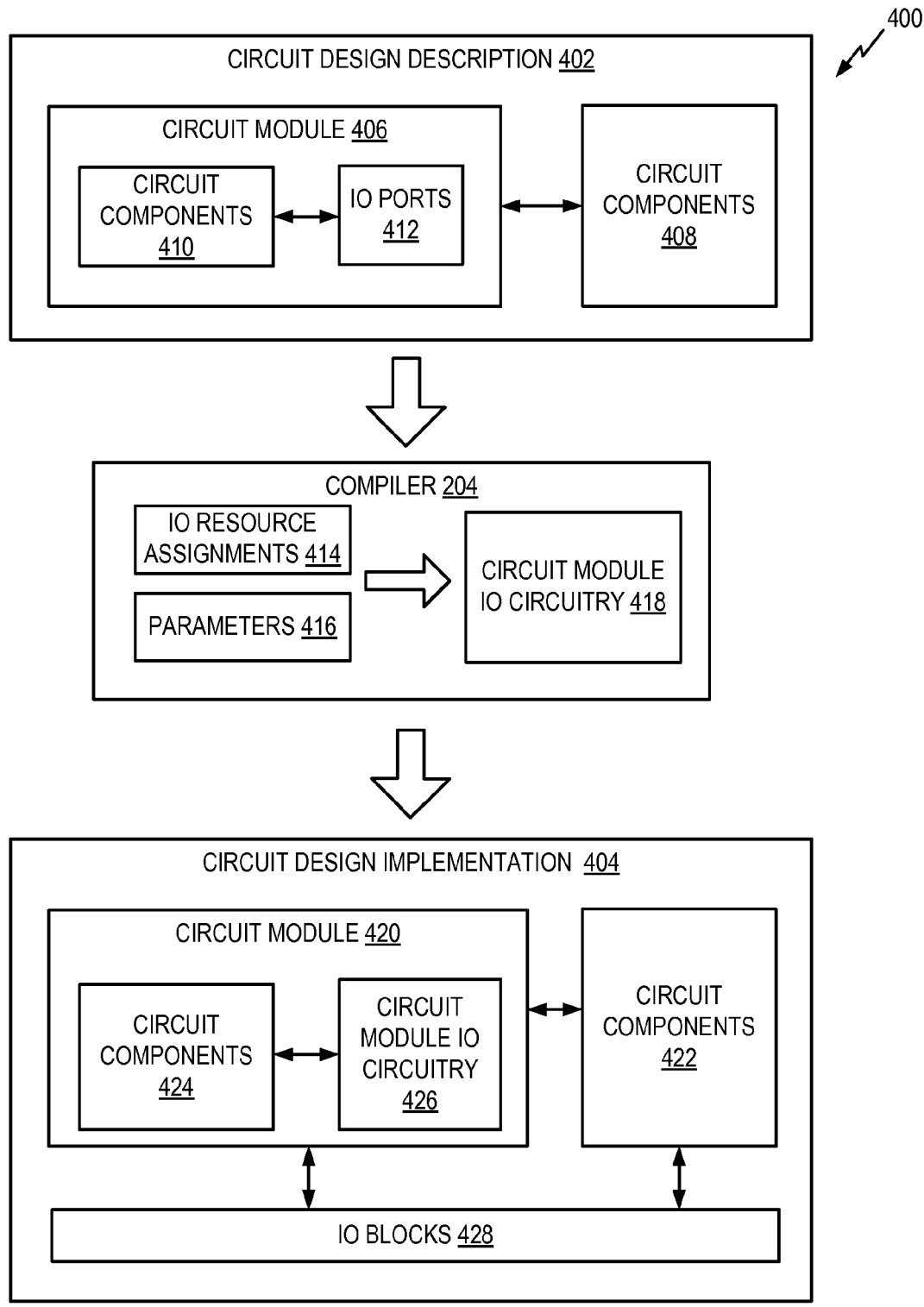
FIG. 4 is a block diagram depicting a flow through the circuit design system of FIG. 2 of another example circuit design according to an example implementation.

FIG. 4 is a block diagram depicting a flow 400 through the circuit design system 200 of another example circuit design according to an example implementation. Elements that are the same or similar to those of FIG. 2 are designated with identical reference numerals and are discussed in detail above. A circuit design description 402 includes instantiated circuit components, including a circuit module 406 and circuit components 408. The circuit module 406 includes circuit components 410 and IO ports 412. The IO ports 412 are general logical elements and not mapped or tied to any particular IO resources of the target programmable IC. The circuit module 406 includes only resource-assignment-independent components and only parameters associated with the resource-assignment-independent components have been specified.

The compiler 204 processes the circuit design description 402 to produce the circuit design implementation 404. For clarity, the specific tools of the compiler 204 have been omitted in FIG. 4. The compiler 204 processes IO resource assignments 414 and parameters 416 for the circuit module 406 to generate circuit module IO circuitry 418. The circuit module IO circuitry 418 includes a resource-assignment-dependent portion of the circuit module 406. The circuit module IO circuitry 418 can include different circuits depending on the IO resource assignments. For example, the IO resource assignments may include an assignment of multiple banks of IOBs to the circuit module 406. The circuit module IO circuitry 418 can include additional circuit(s) to support use of multiple banks of IOBs, such as phase locked loop (PLL) circuits, serializer/deserializer (SERDES) circuits, equalization circuits, and the like. In another example, the IO resource assignments may include an assignment of a single bank of IOBs to the circuit module 406. In such case, the circuit module IO circuitry 418 can include a different configuration of additional circuit(s) to support the use of a single IOB bank.

As noted above, some of parameters can be defined for the circuit module 406 at the design entry phase in order to generate the circuit module 406 in the circuit design description 402. The compiler 204 can translate resource assignments for the circuit module 406 into additional parameters. The compiler 204 uses the IO resource assignments 414 to complete the set of parameters 416 so that the circuit module IO circuitry 418 can be generated. As discussed above, the compiler 204 can also use backwards translation to verify that new implementation(s) of the resource-assignment-dependent portion(s) need to be regenerated in case pre-defined implementation(s) exist.

The circuit design implementation 404 includes physical representations of the circuit module 406 (shown as "circuit module 420") and the circuit components 408 (shown as "other components 422"). The circuit module 420 includes physical implementations of the circuit components 410 (shown as "circuit components 424") and a physical implementation of the circuit module IO circuitry 418 (shown as "circuit module IO circuitry 426"). The circuit module 420 includes both the resource-assignment-independent and the resource-assignment-dependent portions. The circuit module 420 and the circuit components 422 are coupled to IO blocks 428 of the target programmable IC.

Figure 5:
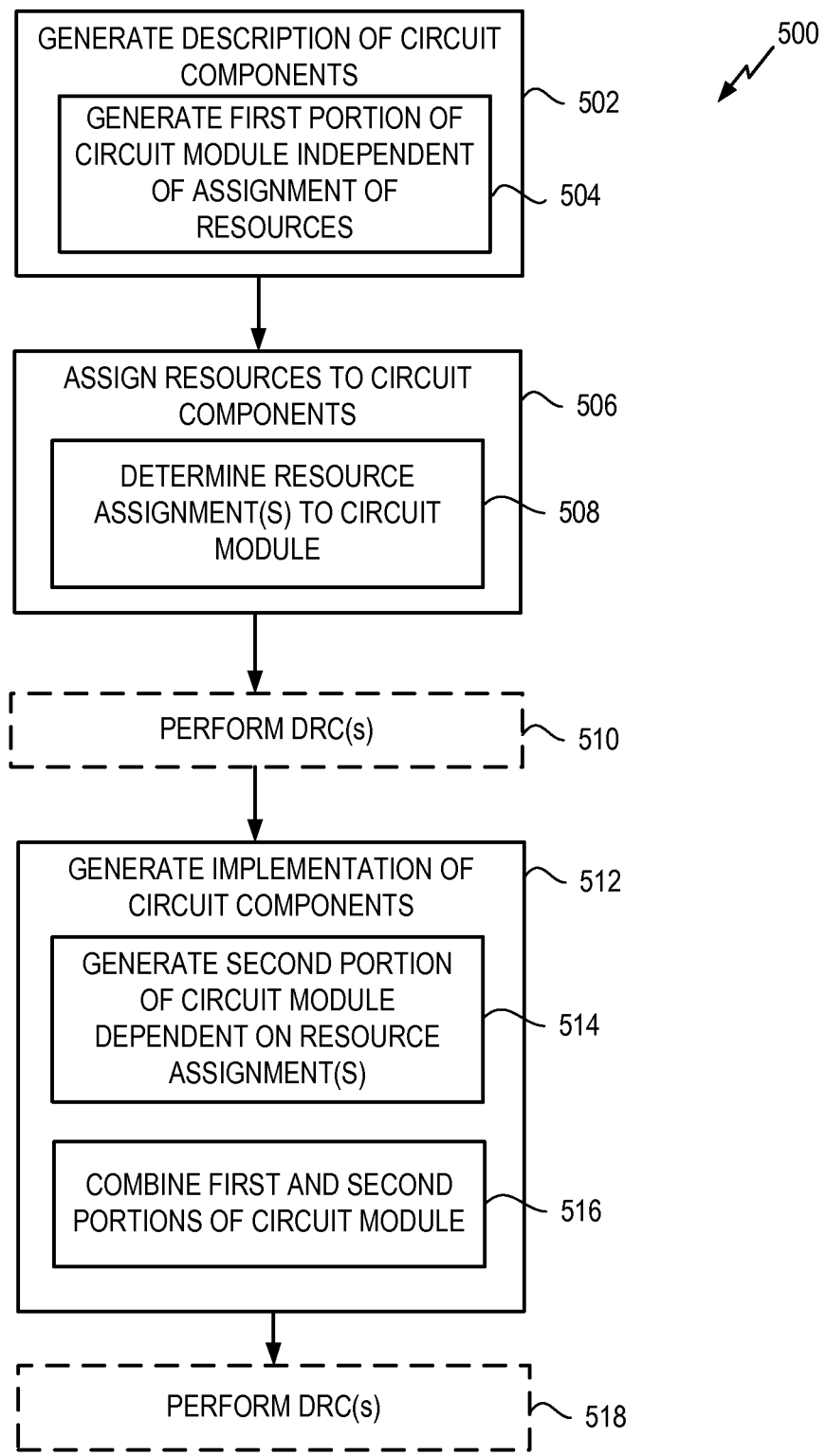
FIG. 5 is a flow diagram depicting a method of implementing a circuit design for a programmable IC according to an example implementation.

FIG. 5 is a flow diagram depicting a method 500 of implementing a circuit design for a programmable IC according to an example implementation. The method 500 can be performed by the circuit design system 200 of FIG. 2 and will be discussed in that context. The method 500 begins at step 502, where the design entry tool 202 and the synthesis tool 212 cooperate to produce a description of circuit components in the circuit design. As described above, the description can be formed from both functional and logical descriptions. The step 502 includes a step 504, where the design entry tool 202 generates a first portion of a circuit module that is independent of assignment of resources in the programmable IC (e.g., resource-assignment-independent portion). At step 506, the resource assignment tool 214 assigns resources to the circuit components. The step 506 includes a step 508, where the resource assignment tool 214 determines resource assignment(s) for the circuit module.

At optional step 510, the DRC tool 207 can perform at least one DRC on the description of the circuit design after resource assignment. At step 512, the implementation tool 209 generates a physical implementation of the circuit components. The step 512 includes steps 514 and 516. At step 514, the circuit module generator 218 generates a second portion of the circuit module that is dependent on resource assignment(s) to the circuit module (e.g., the resource-assignment-dependent portion). At step 516, the circuit module generator 218 combines the first and second portions of the circuit module in the physical implementation. At optional step 518, the DRC tool 207 performs at least one DRC on the physical implementation of the circuit design.

Figure 6:
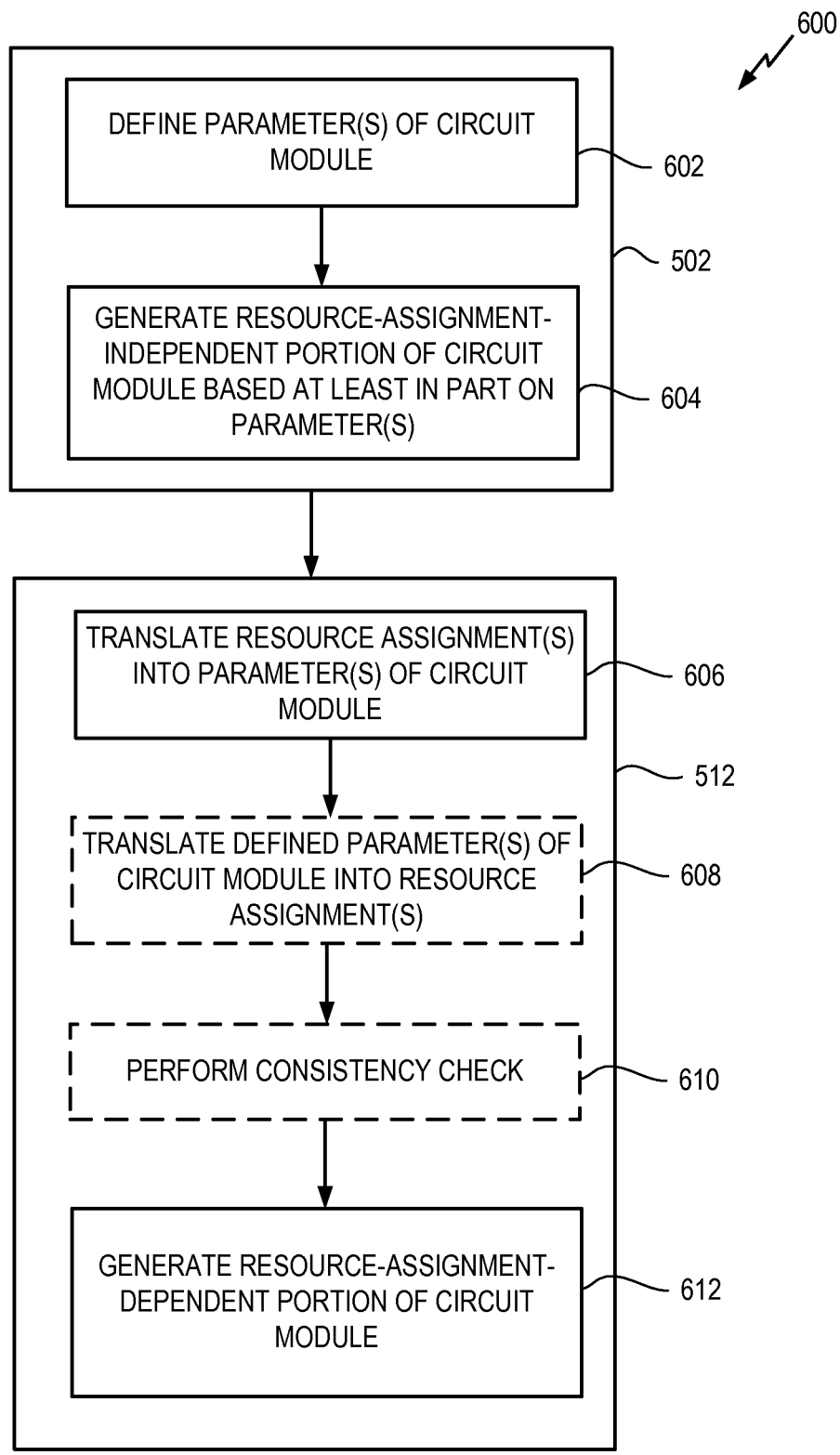
FIG. 6 is a flow diagram depicting a method of implementing a circuit design for a programmable IC according to another example implementation.

FIG. 6 is a flow diagram depicting a method 600 of implementing a circuit design for a programmable IC according to an example implementation. The method 600 can be performed by the circuit design system 200 of FIG. 2 and will be discussed in that context. The method 600 begins at step 602, where the design entry tool 202 defines parameter(s) for the circuit module. At step 604, the design entry tool 202 generates a resource-assignment-independent portion of the circuit module based at least in part on the parameter(s) defined in step 602. Together, steps 602 and 604 can implement step 502 of the method 500 shown in FIG. 5.

At step 606, the circuit module generator 218 translates resource assignment(s) into parameter(s) of the circuit module. At optional step 608, the circuit module generator 218 translates parameters from a pre-defined implementation of the circuit module into resource assignment(s). That is, the circuit module generator 218 can employ both forward and backward translation between resource assignments and parameters. At optional step 610, the circuit module generator 218 can perform a consistency check between resource assignments currently assigned to the circuit module and resource assignments derived from a pre-defined implementation. At step 612, the circuit module generator 218 can generate the resource-assignment-dependent portion of the circuit module. In one example, the circuit module generator 218 generates the resource-assignment-dependent portion based at least in part on the defined parameters from step 602 and the translated parameters from step 606. In another example, if a pre-defined implementation of the circuit module is consistent with current resource assignments as determined in step 610, the circuit module generator 218 generates the resource-assignment-dependent portion using the pre-defined implementation. It should be understood that the pre-defined implementation may itself have been generated based at least in part on parameters defined and translated from a previous implementation of the circuit module.

Figure 7:
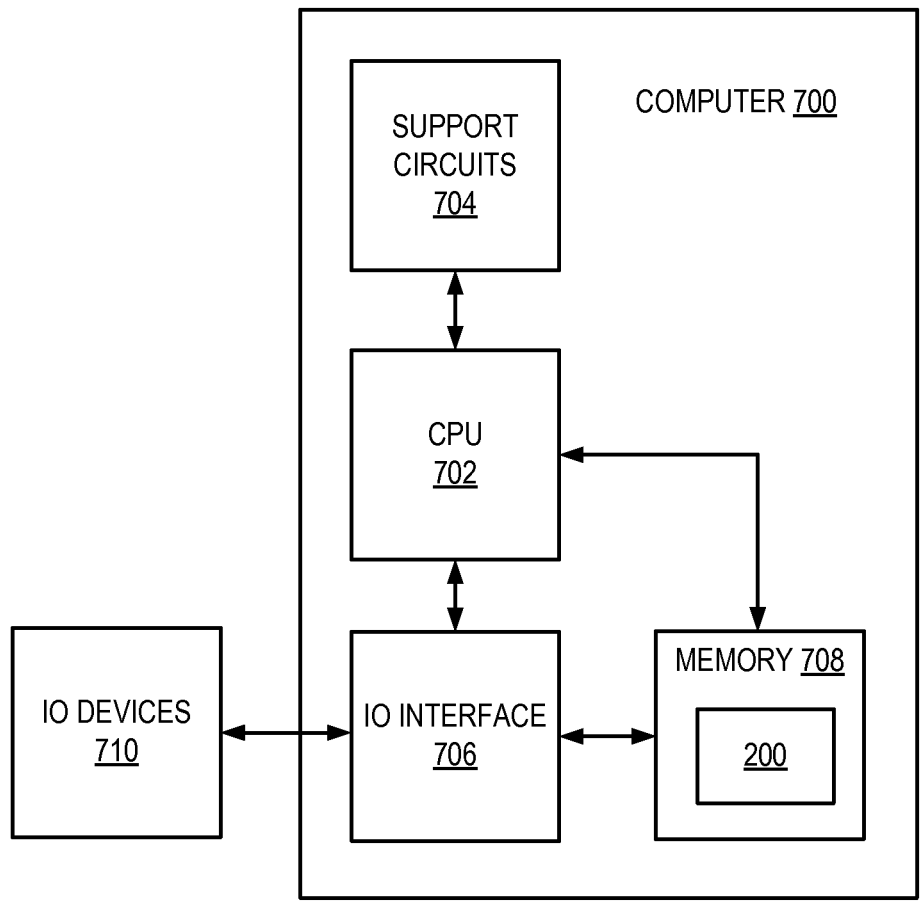
FIG. 7 is a block diagram depicting a computer suitable for implementing the methods and systems described herein.

FIG. 7 is a block diagram depicting a computer 700 suitable for implementing the methods and systems described herein. The computer 700 includes a central processing unit (CPU) 702, a memory 708, various support circuits 704, and an IO interface 706. The CPU 702 can include one or more microprocessors. The support circuits 704 can include conventional cache, power supplies, clock circuits, data registers, IO interfaces, and the like. The IO interface 706 may be directly coupled to the memory 708 or coupled through the CPU 702. The IO interface 706 can be coupled to various IO devices 710, such as conventional keyboard, mouse, printer, display, and the like.

The memory 708 may store all or portions of one or more programs and/or data to implement the systems and methods described herein. For example, the memory 708 can store programs for implementing the circuit design system 200 of FIG. 2. The memory 708 can include one or more of random access memory (RAM), read only memory (ROM), magnetic read/write memory, and the like.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including hand-held devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific example implementations, other and further example implementations may be devised without departing from the basic scope thereof, and the scope thereof is determined by the claims that follow.

What is claimed is:

1. A method of implementing a circuit design for a programmable integrated circuit (IC), comprising:
    on at least one programmed processor, performing operations including:
        generating a description of circuit components of the circuit design including first portion of a circuit module that is independent of assignment of resources of the programmable IC;
        assigning a plurality of the resources of the programmable IC to a plurality of the circuit components including determining at least one resource assignment for the circuit module; and
        generating a physical implementation of the circuit components for implementation in the programmable IC, including generating a second portion of the circuit module that is dependent on the at least one resource assignment, and combining the second portion of the circuit module with the first portion of the circuit module.

2. The method of claim 1, wherein the step of generating the physical implementation comprises:
    translating the at least one resource assignment into at least one parameter of the circuit module; and
    generating the second portion of the circuit module based at least in part on the at least one parameter.

3. The method of claim 1, wherein the step of generating the description further comprises:
    defining at least one parameter of the circuit module; and
    generating the first portion of the circuit module based at least in part on the at least one parameter.

4. The method of claim 1, wherein the step of generating the physical implementation comprises:
    obtaining a pre-defined implementation of the circuit module;
    translating at least parameter of the pre-defined implementation into at least one previous resource assignment; and
    comparing the at least one resource assignment and the at least one previous resource assignment;
    wherein the second portion of the circuit module is generated based at least in part on results of the comparison.

5. The method of claim 1, further comprising:
    performing at least one design rule check (DRC) on the description after the plurality of resources of the programmable IC have been assigned to the plurality of circuit components.

6. The method of claim 1, further comprising:
    performing at least one design rule check (DRC) on the physical implementation after the second portion of the circuit module has been generated.

7. The method of claim 1, wherein the programmable IC is a field programmable gate array (FPGA).

8. The method of claim 1, wherein the resources of the programmable IC comprise IO blocks (IOBs) configured into a plurality of IO banks.

9. The method of claim 6, wherein:
    the at least one resource assignment includes at least one IO bank of the plurality of IO banks; and
    the step of generating the second portion of the circuit module includes instantiating circuitry to support the at least one IO bank.

10. A computer system including a circuit design tool executing therein configured to implement a circuit design for a programmable integrated circuit (IC), wherein the circuit design tool is programmed to:
    generate a description of circuit components of the circuit design including first portion of a circuit module that is independent of assignment of resources of the programmable IC;
    assign a plurality of the resources of the programmable IC to a plurality of the circuit components including determining at least one resource assignment for the circuit module; and
    generate a physical implementation of the circuit components for implementation in the programmable IC, including generating a second portion of the circuit module that is dependent on the at least one resource assignment, and combining the second portion of the circuit module with the first portion of the circuit module.

11. The computer system of claim 10, wherein the circuit design tool is programmed to generate the physical implementation by:
    translating the at least one resource assignment into at least one parameter of the circuit module; and
    generating the second portion of the circuit module based at least in part on the at least one parameter.

12. The computer system of claim 10, wherein the circuit design tool is programmed to generate the description by:
  defining at least one parameter of the circuit module; and
  generating the first portion of the circuit module based at least in part on the at least one parameter.

13. The computer system of claim 10, wherein the circuit design tool is programmed to generate the physical implementation by:
  obtaining a pre-defined implementation of the circuit module;
  translating at least parameter of the pre-defined implementation into at least one previous resource assignment;
  comparing the at least one resource assignment and the at least one previous resource assignment;
  wherein the second portion of the circuit module is generated based at least in part on results of the comparison.

14. The computer system of claim 10, wherein the programmable IC is a field programmable gate array (FPGA).

15. The computer system of claim 10, wherein the resources of the programmable IC comprise IO blocks (IOBs) configured into a plurality of IO banks.

16. A non-transitory computer-readable storage medium comprising instructions that, when executed in a computer system, cause the computer system to carry out a method of implementing a circuit design for a programmable integrated circuit (IC), comprising:
  generating a description of circuit components of the circuit design including first portion of a circuit module that is independent of assignment of resources of the programmable IC;
  assigning a plurality of the resources of the programmable IC to a plurality of the circuit components including determining at least one resource assignment for the circuit module; and
  generating a physical implementation of the circuit components for implementation in the programmable IC, including generating a second portion of the circuit module that is dependent on the at least one resource assignment, and combining the second portion of the circuit module with the first portion of the circuit module.

17. The non-transitory computer-readable storage medium of claim 16, wherein the step of generating the physical implementation comprises:
  translating the at least one resource assignment into at least one parameter of the circuit module; and
  generating the second portion of the circuit module based at least in part on the at least one parameter.

18. The non-transitory computer-readable storage medium of claim 17, wherein the step of generating the description further comprises:
  defining at least one parameter of the circuit module; and
  generating the first portion of the circuit module based at least in part on the at least one parameter.

19. The non-transitory computer-readable storage medium of claim 16, wherein the step of generating the physical implementation comprises:
  obtaining a pre-defined implementation of the circuit module;
  translating at least parameter of the pre-defined implementation into at least one previous resource assignment;
  comparing the at least one resource assignment and the at least one previous resource assignment;
  wherein the second portion of the circuit module is generated based at least in part on results of the comparison.

20. The non-transitory computer-readable storage medium of claim 16, wherein the programmable IC is a field programmable gate array (FPGA).

* * * * *